(12) United States Patent
Dakshina-Murthy (10) Patent No.: US 6,406,950 B1
(45) Date of Patent: Jun. 18, 2002

(54) DEFINITION OF SMALL DAMASCENE METAL GATES USING REVERSE THROUGH APPROACH

(75) Inventor: Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/732,125

(22) Filed: Dec. 7, 2000

(51) Int. Cl.[7] .......................................... H01L 21/338
(52) U.S. Cl. ..................... 438/183; 438/279; 438/303; 438/305; 438/585; 438/586; 438/595
(58) Field of Search ................................ 438/183, 197, 438/275, 279, 286, 299, 301, 303, 305, 306, 307, 585, 586, 587, 594, 595, 976

(56) References Cited

U.S. PATENT DOCUMENTS

| | | | | |
|---|---|---|---|---|
| 4,313,782 A | | 2/1982 | Sokoloski | 156/628 |
| 4,358,340 A | | 11/1982 | Fu | 156/643 |
| 4,440,493 A | | 4/1984 | Hiraga | 355/86 |
| 4,569,119 A | * | 2/1986 | Terada et al. | 29/571 |
| 4,745,082 A | * | 5/1988 | Kwok | 437/39 |
| 5,036,017 A | | 7/1991 | Noda | 437/41 |
| 5,202,272 A | | 4/1993 | Hsieh | 437/29 |
| 5,397,715 A | | 3/1995 | Miller | 437/27 |
| 5,532,114 A | | 7/1996 | Bae | 430/312 |
| 5,672,531 A | | 9/1997 | Gardner et al. | 437/44 |
| 5,801,088 A | | 9/1998 | Gardner et al. | 438/585 |
| 5,856,225 A | * | 1/1999 | Lee et al. | 438/291 |
| 5,998,285 A | * | 12/1999 | Chou | 438/585 |
| 6,033,963 A | * | 3/2000 | Huang et al. | 438/303 |
| 6,051,487 A | * | 4/2000 | Gardner et al. | 438/585 |
| 6,103,559 A | * | 8/2000 | Gardner et al. | 438/183 |
| 6,200,865 B1 | * | 3/2001 | Gardner et al. | 438/291 |
| 6,300,201 B1 | * | 10/2001 | Shao et al. | 438/281 |
| 6,326,251 B1 | * | 12/2001 | Gardner et al. | 438/197 |

OTHER PUBLICATIONS

Stanley Wolf and Richard N. Tauber; *Silicon Processing for the VLSI Era, vol. 1: Process Technology*; pp. 555–579; 1986.

Stanley Wolf and Richard N. Tauber; *Silicon Processing for the VLSI Era, vol. 2: Process Integration*; pp. 327–335, 493–496; 1990.

Mizuki Ono et al.;*A 40 nm Gate Length n–MOSFET*; 8093 IEEE Transactions on Electron Devices; pp. 1–5; Oct. 1995.

* cited by examiner

*Primary Examiner*—Olik Chaudhuri
*Assistant Examiner*—Jack Chen
(74) *Attorney, Agent, or Firm*—Timothy M. Honeycutt (57) ABSTRACT

Various methods of fabricating circuit devices incorporating a gate stack are disclosed. In one aspect, a method of fabricating a circuit device on a substrate is provided that includes forming a first insulating film on the substrate and etching the first insulating film to define a temporary gate structure. A second insulating film is formed on the substrate adjacent to the temporary gate structure. The temporary gate structure is removed to leave an opening extending to the substrate. A gate stack is formed in the opening. The process of the present invention provides for metal gate definition with sub-lithographic limit critical dimensions.

26 Claims, 5 Drawing Sheets

DEFINITION OF SMALL DAMASCENE METAL GATES USING REVERSE THROUGH APPROACH

BACKGROUND OF THE INVENTION

1. Field of the Invention

This invention relates generally to semiconductor processing, and more particularly, to methods of fabricating circuit device gate stack structures.

2. Description of the Related Art

Insulated gate field effect transistors, such as metal oxide semiconductor field effect transistors ("MOSFETs"), are some of the most commonly used electronic components in modern integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented on silicon consists of a source and a drain formed in a silicon substrate, and separated laterally to define a channel region. A gate electrode composed of a conducting material, such as aluminum or polysilicon is positioned over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then lithographically patterned and anisotropically etched back to the upper surface of the substrate leaving a gate electrode stack consisting of a polysilicon gate electrode stacked on top of a gate oxide layer. Following formation of the gate electrode stack, a source and a drain are formed by implanting a dopant species into the substrate. The gate electrode stack acts as a hard mask against the implant so that the source and drain are formed in the substrate self-aligned to the gate electrode stack.

In conventional processing, the gate oxide layer and electrode are formed on the semiconductor wafer in a generally parallel orientation relative to the horizontal plane of the wafer. The source and drain are formed on opposite sides of the gate electrode stack with the lateral spacing between the source and the drain defining a channel region for the MOSFET. In conjunction with several other factors, the width of the channel region or "channel length" determines the ultimate speed of the MOSFET. As a general rule of thumb, smaller channel widths translate into both higher switching speeds and smaller die areas.

The minimum channel length attainable in conventional processing is dictated, in large part, by the width of the gate oxide layer and the gate electrode. As with other horizontal dimensions on a given wafer, the minimum achievable width of the gate oxide layer and gate electrode is determined by the resolution of the photolithographic system used to pattern the wafer. The resolution of an optical photolithographic system is normally an aggregate of a number of physical mechanisms, such as lens aberrations, light spectrum, and diffraction effects. However, diffraction effects constitute the dominant limitation to resolution, particularly in sub 1.0 $\mu$m processing.

The fabrication of increasingly smaller features such as gate electrode stacks relies on the availability of increasingly higher resolution optical lithography equipment. Designers of optical lithography equipment have employed several techniques to combat the deleterious effects of light diffraction. Some of these techniques include decreasing the wave length of the illuminating light, increasing the numerical aperture of the system, increasing the contrast of the resist by modifying resist chemistry or by creating entirely new resists, and adjusting the coherence of the optical system. Even with the availability of these various resolution enhancing techniques, the minimum critical dimension patternable by prevailing lithographic technology establishes a limit on packing density.

Electron beam lithography has occasionally been used as a substitute for optical lithography in circumstances where the resolution limits of the prevailing optical lithography techniques prevent successful fabrication of a particular integrated circuit. However, there are several drawbacks associated with electron beam lithography, including resolution limitations associated with electrons forward scattered in the resist and back scattered from the substrate, swelling, which often occurs during development of a negative e-beam resist, extremely slow processing times when compared to optical projection systems, and significantly higher cost of electron beam lithography systems compared to optical steppers.

X-ray lithography has also been used occasionally in place of optical lithography to obtain resolutions in the sub-1.0 $\mu$m area. However, as with electron beam lithography, certain technical difficulties have prevented X-ray lithography from supplanting optical lithography as the lithographic process of choice in:mass produced integrated circuits. X-ray reticles have proven to be extremely difficult to reliably manufacture.

The present invention is directed to overcoming or reducing the effects of one or more of the foregoing disadvantages.

SUMMARY OF THE INVENTION

In accordance with one aspect of the present invention, a method of fabricating a circuit device on a substrate is provided that includes forming a first insulating film on the substrate and etching the first insulating film to define a temporary gate structure. A second insulating film is formed on the substrate adjacent to the temporary gate structure. The temporary gate structure is removed to leave an opening extending to the substrate. A gate stack is formed in the opening.

In accordance with another aspect of the present invention, a method of fabricating a transistor on a substrate is provided that includes forming a first insulating film on the substrate and etching the first insulating film to define a temporary gate structure. First and second source/drain regions are formed in the substrate. A second insulating film is formed on the substrate adjacent to the temporary gate structure. The temporary gate structure is removed to leave an opening extending to the substrate and a gate stack is formed in the opening.

In accordance with another aspect of the present invention, a method of fabricating a circuit device on a substrate is provided that includes forming a first insulating film on the substrate and etching the first insulating film to define a temporary gate structure. A first ion implant is performed to define lightly doped drain structures. A second insulating film is formed on the substrate adjacent to the temporary gate structure. A second ion implant is performed to define heavier doped regions overlapping the lightly doped drain structures. The temporary gate structure is removed to leave an opening extending to the substrate and a gate stack is formed in the opening.

In accordance with another aspect of the present invention, a method of fabricating a circuit device on a substrate is provided that includes forming a first insulating film on the substrate and etching the first insulating film to define a temporary gate structure. A first ion implant is performed to define lightly doped drain structures. A first spacer and a second spacer are formed adjacent to the temporary gate structure. A second ion implant is performed to define heavier doped regions overlapping the lightly doped drain structures. A third insulating film is formed adjacent to the temporary gate structure. The temporary gate structure is removed to leave an opening extending to the substrate and a gate stack is formed in the opening.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
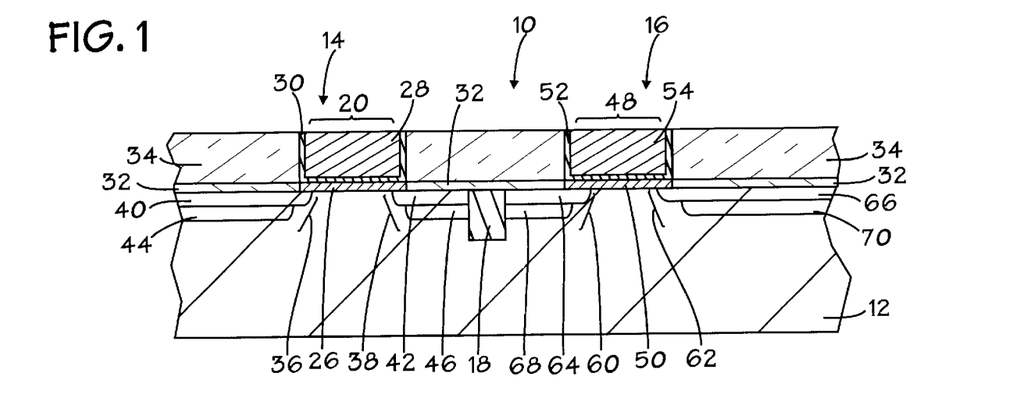
FIG. 1 is a cross-sectional view of an exemplary embodiment of an integrated circuit fabricated on a substrate in accordance with the present invention.

In the drawings described below, reference numerals are generally repeated where identical elements appear in more than one figure. FIG. 1 is a cross-sectional view of an exemplary embodiment of an integrated circuit 10 fabricated on a semiconductor substrate 12. The integrated circuit 10 includes a plurality of circuit devices, two of which are depicted and designated 14 and 16 respectively. The circuit devices 14 and 16 are depicted as field effect transistors. The substrate 12 may be composed of n-doped silicon, p-doped silicon, silicon-on-insulator or other suitable substrate materials. The transistors 14 and 16 are isolated electrically laterally from each other and from other devices on the substrate 12 by an isolation structure, a portion of which is shown and designated 18. The transistor 14 includes a gate stack 20 fabricated on the substrate 12 and consisting of a gate dielectric layer 26 and a gate electrode 28. An adhesion layer 30 is interposed between the gate electrode 28 and the gate dielectric layer 26. An insulating film 32 is formed on the upper surface of the substrate 12 adjacent to the gate stack 20. A second insulating film 34 is formed over the insulating film 32 and may be substantially planar with the gate stack 20 as shown. The transistor 14 is provided with dual graded source/drain regions 36 and 38, consisting respectively of lightly doped drain ("LDD") structures 40 and 42 and overlapping heavier doped regions 44 and 46. The phrase "source/drain region(s)" is used herein to describe a region that may serve as either a source or a drain. The skilled artisan will appreciate that a source/drain region may function as a source or a drain depending upon how it is connected to subsequent metallization.

The transistor 16 is similarly provided with a gate stack 48 positioned on the substrate 12 and consisting of a gate dielectric layer 50, an adhesion layer 52 and a gate electrode 54. As with the transistor 14, the transistor 16 is provided with dual graded source/drain regions 60 and 62, consisting respectively of LDD structures 64 and 66 and overlapping heavier doped regions 68 and 70.

Figure 2:
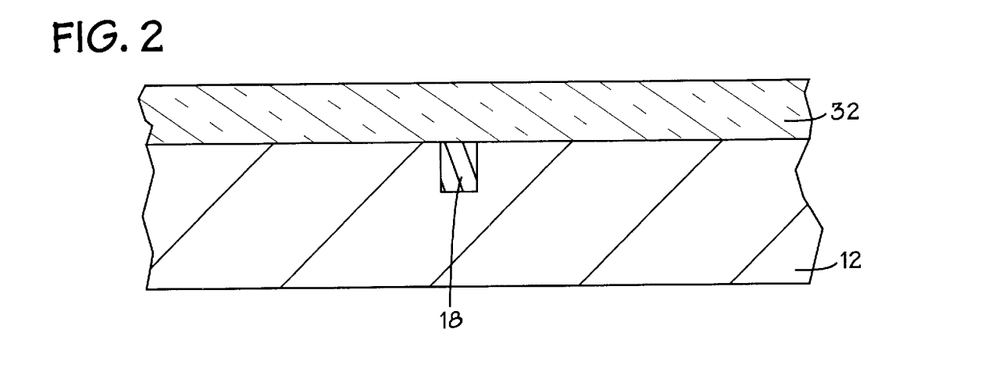
FIG. 2 is a cross-sectional view of the substrate of FIG. 1 following formation of an insulating film thereon in accordance with the present invention.

An exemplary process flow or fabricating the transistors 14 and 16 in accordance with the present invention may be understood by referring now to FIGS. 2, 3, 4, 5, 6, 7, 8, 9 and 10, and initially to FIG. 2. The isolation structure 18 is initially fabricated in the substrate 12 and may consist of a field oxide region, a shallow trench isolation structure or other suitable isolation structure as desired. In the illustrated embodiment, the isolation structure 18 is a shallow trench isolation structure composed of an oxide of silicon. Next, the insulating film 32 is fabricated on the upper surface of the substrate 12. In an exemplary embodiment, the insulating film 32 is composed of oxide and may be formed on the substrate 12 by, for example, thermal oxidation or chemical vapor deposition ("CVD") using tetra-ethyl-ortho-silicate or silane-based CVD processes. In an exemplary embodiment, the insulating film 32 is composed of CVD oxide deposited to a thickness of about 1500 to 2000 Å.

Figure 3:
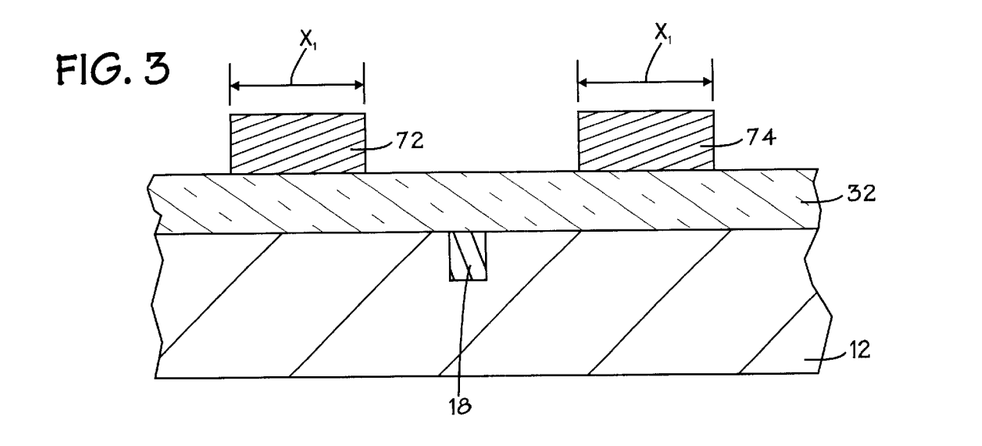
FIG. 3 is a cross-sectional view like FIG. 2 depicting the masking of the insulating film in accordance with present invention.

Referring now to FIG. 3, the insulating film 32 is masked with mask, structures 72 and 74, which may be composed of well-known resist materials, or oxide or nitrite materials commonly used as hard masks. In an exemplary embodiment, the mask structures 72 and 74 are composed of photoresist and are patterned with a lateral dimension $X_1$ that corresponds to the maximum resolution, i.e., the minimum patternable critical dimension ("CD"), for the available lithographic patterning system. Optionally, the dimension $X_1$ may be greater than the minimum CD. As described more fully below, the masks 72 and 74 will be utilized to provide for the etch definition or a pair of temporary gate structures from the insulating film 32.

Figure 4:
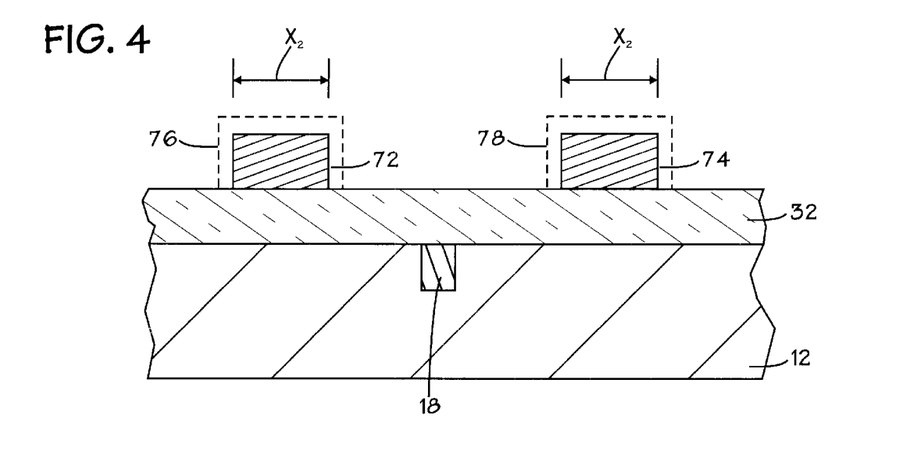
FIG. 4 is a cross-sectional view like FIG. 3 depicting the trimming of the lateral dimension of the masks in accordance with the present invention.

Referring now to FIG. 4, the mask, structures 72 and 74 are trimmed from their original dimensions represented by the dashed boxes 76 and 78 to the new and smaller lateral dimensions shown. Although the goal of the trim is to achieve a mask CD below the minimum CD for the prevailing lithographic patterning technology, the exact amount of the trim is largely a matter of design discretion. In an exemplary embodiment, the new lateral dimension $X_2$ will be approximately eighty (80) nm less than the original lateral dimension $X_1$. Well-known resist trimming techniques may be used to reduce the lateral dimension of the mask structure 72 and 74 to the new dimension $X_2$. In an exemplary embodiment, the trim is performed using a biased wafer directional plasma etch using HBr and $O_2$ or $O_2$ alone.

Figure 5:
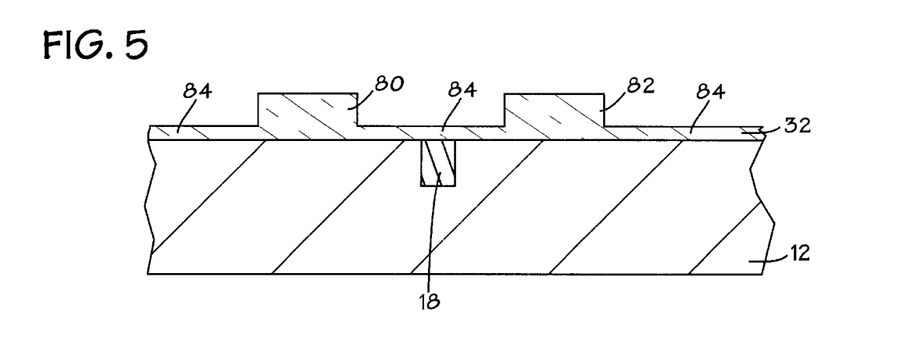
FIG. 5 is a cross-sectional view like FIG. 4 depicting the etch definition of temporary gate structures from the insulating film in accordance with the present invention.

Referring now to FIG. 5, the insulating film 32 is directionally etched to define respective temporary gate structures 80 and 82. The insulating film 32 may be etched selectively to the substrate 12, or the etch may be timed to leave a portion of the insulating film 32 overlying the substrate 12 as shown. The thinned portions 84 of the film 32 will thus serve E a screen oxide during subsequent ion implantation steps to be described below. The temporary gate structure 80 and 82 are preferably of sufficient height to remain intact Following a subsequently performed planarization step. If the etch is performed with an appropriately chosen time designed to yield the thinned portions 84 of the insulating film 32, the thinned portions, 84 may have a thickness of about 100 to 300 Å. In an exemplary embodiment, approximately 1000 Å of the insulating film is removed to define the temporary gate structures 80 and 82. Well-known directional etching techniques, such as reactive ion etching, chemical plasma etching, or the like may be used along with well-known etch chemistries suitable for directionally etching oxide, such as. for example, $CF_4/O_2$. Following the directional etch, the resist structures 72 and 74 are stripped by ashing, solvent techniques or combinations of these or the like.

Figure 6:
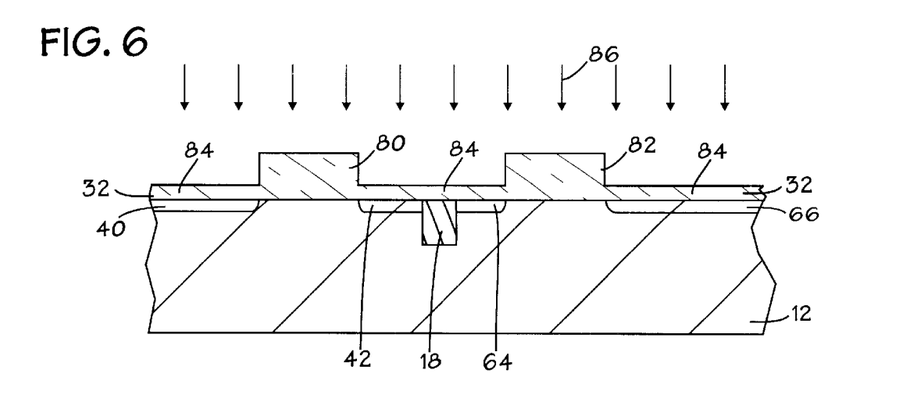
FIG. 6 is a cross-sectional view like FIG. 5 formation of LDD structures in accordance with the present invention.
Figure 7:
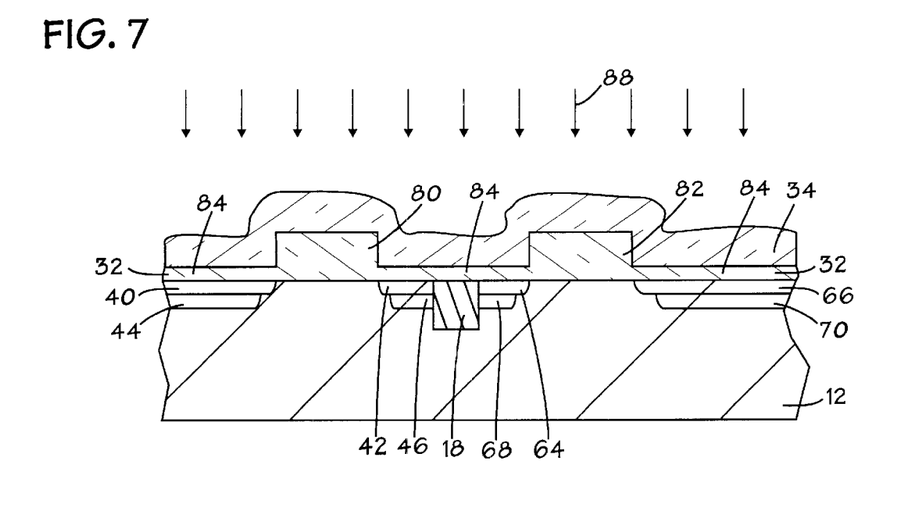
FIG. 7 is a cross-sectional view like FIG. 6 depicting formation of another insulating film and overlapping doped regions in accordance with the present invention.

Referring now to FIG. 6, the LDD structures 40, 42, 64 and 66 are formed in the substrate 12 by ion implantation or diffusion of dopant ions 86. In an exemplary embodiment, the dopant ions 86 are introduced into the substrate by ion implantation through die thinned portions 84 of the insulating films 32, which act as a screen oxide. The energy and dosage for the LDD implant are largely matters of design discretion. The dopant species is likewise a matter of design discretion. If desired, the LDD structures 40 and 42 may be formed separately from and with a different conductivity type, e.g., p-type or n-type, than the LDD structures 64 and 66. This may be accomplished using well-known alternating masking to the substrate 12 on either side of the isolation structure 18. The fabrication of the insulating film 34 depicted in FIG. 1 may be understood by referring now to FIGS. 7 and 8. Initially, the insulating film 34 is blanket deposited over the insulating film 32 and the temporary gate strictures 80 and 82. The insulating film 34 is advantageously composed of a material that will enable the insulating film 32 to be etched selectively thereto to subsequently remove the temporary gate structures 80 and 82 as described more fully below. Exemplary materials include silicon nitride and silicon oxynitride. In an exemplary embodiment, the insulating film 34 is composed of silicon nitride and may be deposited over the insulating film 32 by low pressure or plasma enhanced CVD to a thickness of about 500 to 1000 Å. Following ate deposition of the insulating film 34, the overlapping heavier doped regions 44, 46, 68 and 70 are established in the substrate 12 by implantation of dopant ions 88. Note that the energy of the implant will need to be tailored accordingly to take into account the range of the implanted ions 88 through the deposited insulating film 34, the thinned portions, 84 of the insulating Film 32 and the substrate 12.

Figure 8:
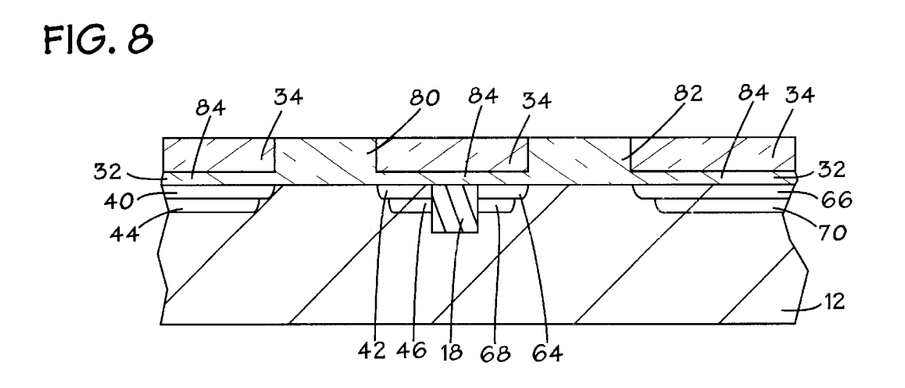
FIG. 8 is a cross-sectional view like FIG. 7 depicting planarization of the top insulating film in accordance with the present invention.

As shown in FIG. 8, the insulating film 34 is plagiarized substantially to the temporary gate structures 80 and 82. The goal is to expose the upper surfaces of the gate structures 80 and 82. This planarization may be performed using well-known chemical mechanical polishing ("CMP"), etchback planarization or other planarization techniques.

Figure 9:
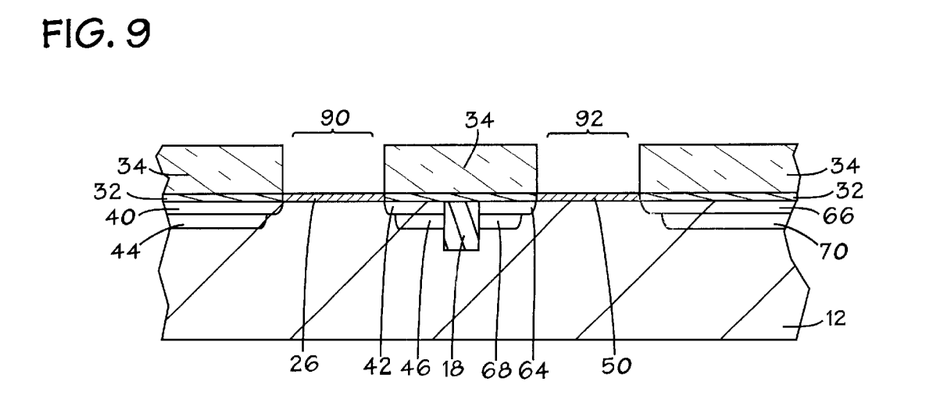
FIG. 9 is a cross-sectional view like FIG. 8 depicting removal of the temporary gate structures in accordance with the present invention.

Referring now to FIG. 9, the temporary gate structures 80 and 92 are removed by directional etching with the insulating film 34 serving as a hard mask to protect the underlying structures and leave openings 90 and 92 in which gate stacks may be later fabricated as described below. The directional etch of the temporary gate structure 80 and 82 may be performed using RIE, chemical plasma etching or other well-known anisotropic etching techniques using a variety of etch chemistries suitable for etching oxide directionally, such as, for example, $CF_4/O_2$. Endpoint may be used to terminate the etch upon exposure of the underlying substrate 12, Alternatively, a timed etch may be used to terminate the etch before complete removal of the gate structures 80 and 82 in order to prevent plasma damage to the underlying substrate regions where gate dielectric layer will be subsequently formed. If desired, a brief HF dip may follow the plasma etch to ensure complete exposure of the substrate 12. Optionally, the temporary gate structures 80 and 82 may be removed by an HF dip. However, it should be understood that an HF dip may result in some undercut of the insulating firm 32 beneath the edges of the insulating film 34.

With the substrate 12 exposed, the gate dielectric layers 26 and 50 are formed by thermal oxidation or CVD as desired. The gate dielectric layers 26 and 50 may be composed of thermal or CVD oxide, or materials with a higher dielectric constant, such as, for example, tantalum pentoxide, titanium dioxide, barium titanate ($BaTiO_3$), strontium titanate ($SrTiO_3$), or the like deposited by CVD or physical vapor deposition ("PVD"). As the skilled artisan will appreciate, higher dielectric constant materials will yield a relatively thin equivalent thickness of oxide in a thicker and thus more electrically robust structure. The thicknesses of the dielectric layers 26 and 50 will depend in large part on design discretion, the dielectric constant of the material used to form the film 26 and 50 and the electrical requirements for the transistors 14 and 16. In an exemplary embodiment, the gate dielectric layers 26 and 50 are composed of thermal oxide and formed with a thickness of about 15 to 40 Å.

Figure 10:
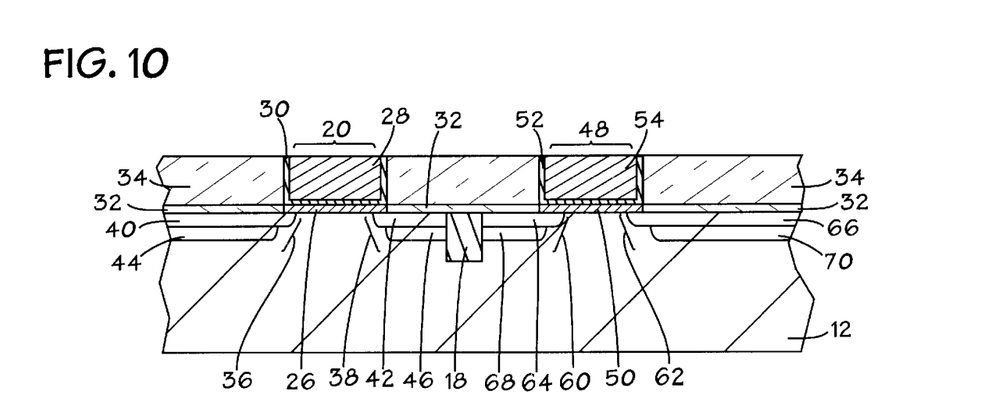
FIG. 10 is a cross-sectional view like FIG. 9 depicting formation of a gate stack in accordance with the present invention.

The fabrication of the gate electrodes 28 and 54 and their respective adhesion layers 30 and 52 may be understood by referring now to FIG. 10. The adhesion layers 30 and 52 may be fabricated by a blanket CVD or PVD of a suitable adhesion film material, such as, for example, titanium nitride, a laminate of titanium and titanium nitride, titanium:tungsten or the like. In an exemplary embodiment, the adhesion films 30 and 52 are fabricated by a blanket CVD of titanium nitride to a thickness of about 100 to 300 Å. The gate electrodes 28 and 54 are thereafter fabricated by either a PVD or CVD of a conducting material followed by a planarization step to yield the defined gate stacks 20 and 48 shown in FIG. 10. The conducting material may be tungsten, titanium, tungsten nitride, tantalum, or the like. In an exemplary embodiment, tungsten is deposited by CVD using a reduction of WF6 in a silane ambient. The planarization of the deposited conducting film to yield the gate electrodes 28 and 54 may be again by CMP, etchback planarization or the like.

A desirable overlap between the LDD structures 40, 42, 64 and 66 and their respective gate electrodes 28 and 54 may be provided by subjecting the substrate 12 to an anneal that will not only provide for dopant migration but also repair any crystalline damage of the substrate 12 produced by the ion implantations. The parameters for the anneal are largely a matter of design discretion. In an exemplary embodiment, the substrate 12 may be subjected to a rapid thermal anneal process at about 800 to 1100° C. for about 10 to 60 seconds. The anneal yields the overlapped source/drain orientations depicted in FIG. 1. Optionally, the anneal could be performed prior to the fabrication of the gate dielectric layers 26 and 50 and gate electrodes 28 and 54.

Figure 11:
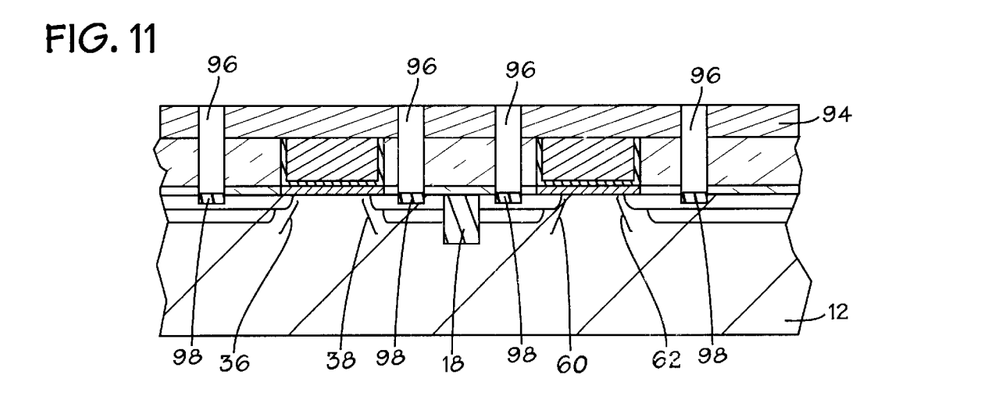
FIGS. 11 and 12 depict cross-sectional views like FIG. 10 and show exemplary steps for fabricating source/drain and gate contacts in accordance with the present invention.
Figure 12:
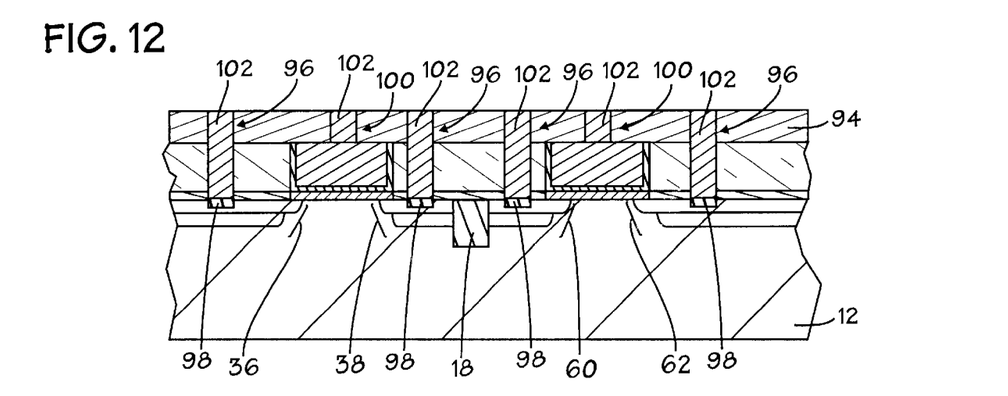

Referring now to FIGS. 11 and 12, electrical contacts to the source)drain regions 36 and 62 and the gate electrodes 28 and 54 may he formed. Initially, an interlevel dielectric layer 94 of oxide, nitride or the like is formed on the substrate 12 as shown in FIG. 11. Holes 96 are next anisotropically etched down through the insulating layers 94, 34 and 32 to the source/drain regions 36, 38, 60 and 62 and refractory metal silicide regions 98 are formed thereon using well-known deposition and annealing techniques. After silicidation, holes 100 are etched in the layer 94 down to the gate electrodes 28 and 54 and contacts 102 are formed in the holes 96 and 100 by metal deposition and planarization as shown in FIG. 12. The contacts 102 may have the same composition as the gate electrodes 28 and 54 and may include adhesion layers (not shown).

Figure 13:
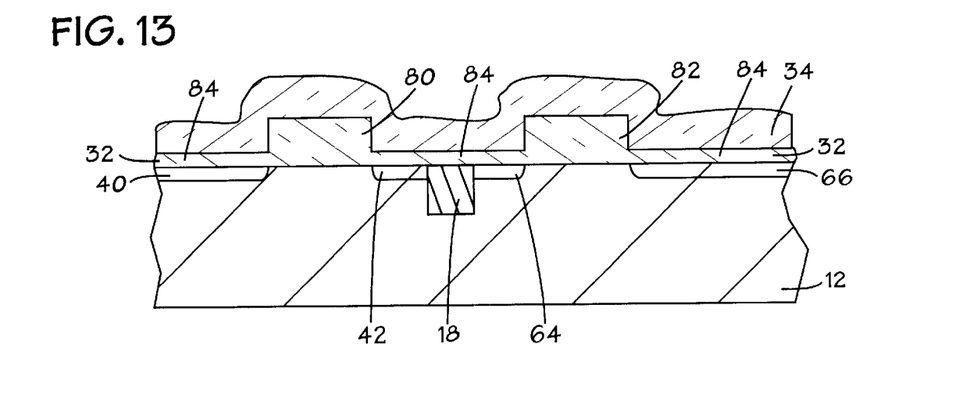
FIGS. 13–15 depict cross-sectional views of a substrate and show aspects of an alternate exemplary process of fabricating circuit devices in accordance with the present invention.
Figure 14:
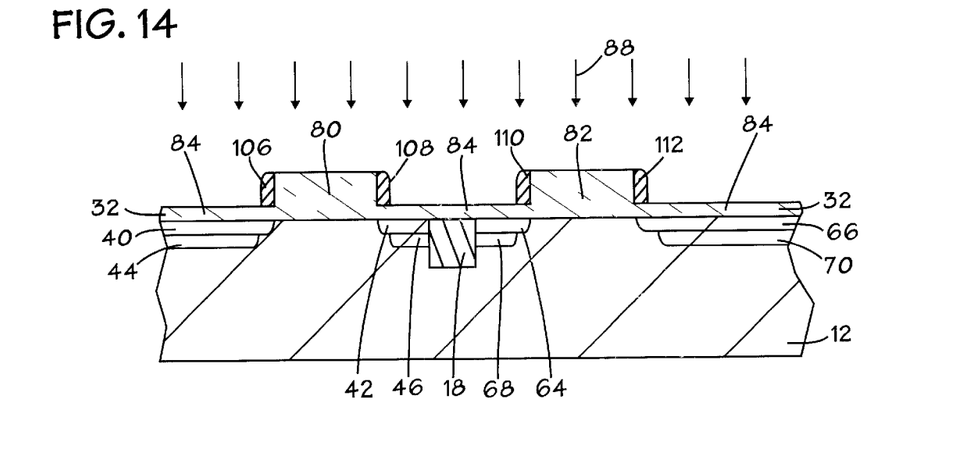
Figure 15:
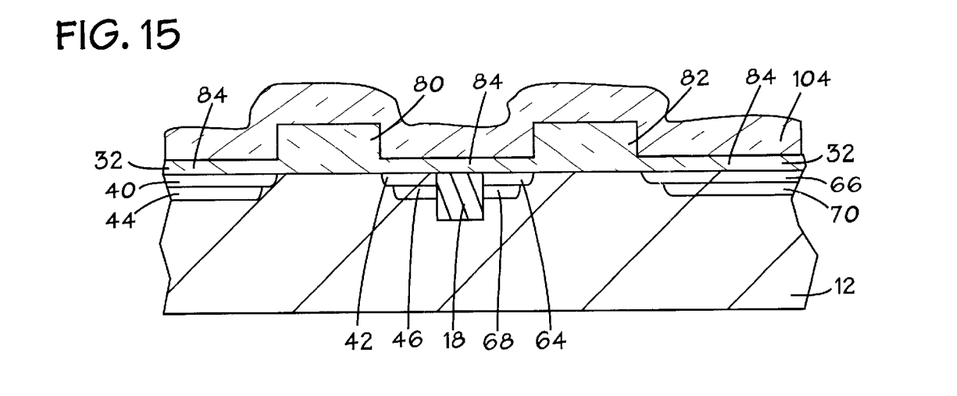

An alternate exemplary process flow in accordance with the present invention may be understood by referring now to FIGS. 13, 14 and 15 and initially to FIG. 13. The substrate 12 may be processed as generally described above in conjunction with FIGS. 2, 3, 4, 5 and 6 to yield the temporary gate structures 80 and 82 and LDD structures 40, 42, 64 and 66 as shown in FIG. 13. Thereafter, the insulating film 34 may be formed over the temporary gate structures 80 and 82 as generally described above. However, in this illustrative embodiment, the insulating film 34 is subjected to an anisotropic etch to define respective pairs of sidewall spacers 106, 108, 110 and 112 prior to an ion implant to establish the overlapping heavier doped regions 44, 46, 68 and 70. As shown in FIG. 14, the overlapping heavier doped regions 44, 46, 68 and 70 are established in the substrate 12 following the etch definition of the spacers 106, 108, 110 and 112 by implantation of impurity ions 88 as shown. Next, the spacers 106, 108, 110 and 112 may be stripped by a hot phosphoric acid dip and a second insulating film 104 may be deposited over the temporary gate structures 80 and 82 as shown in FIG. 15. Optionally, the spacers 96, 98, 100 arid 102 may be left in place and the film 104 deposited over both the spacers 96, 98, 100 and 102 and the temporary gate structures 80 and 82. Thereafter, the substrate 12 may be processed as generally described above and depicted in FIGS. 8, 9, 10, 11 and 12.

The skilled artisan will appreciate that the process of the present invention provides for the manufacture of gate stack structures with lateral dimensions below the resolution limit of prevailing lithographic patterning systems. Modern metal gate technology is incorporated, providing extra thermal budgeting flexibility for later process steps. The gate structure may be used in transistors or other circuit devices utilizing a gate stack.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device on a substrate, comprising:

forming a first insulating film on the substrate;

etching the first insulating film to define therefrom a temporary gale structure and a screen insulating layer adjacent to the temporary gate structure;

forming a second insulating film on the substrate adjacent to the temporary gate structure;

removing the temporary gate structure to define an opening in the screen insulating and the second insulating film extending to the substrate; and forming a gate stack in the opening.

2. The method of claim 1, wherein the process of defining the temporary gale structure comprises applying a mask having a width to a portion of the first insulating film, trimming the width of the mask, and etching unmasked portions of the first insulating film.

3. The method of claim 2, wherein the width of the mask after trimming is less than a maximum resolution of a lithographic patterning system used to initially define the mask.

4. The method of claim 2, wherein the mask comprises resist.

5. The method of claim 1, wherein the process of forming the second insulating film comprises depositing insulating material and planarizing the insulating material to the temporary gate structure.

6. The method of claim 1, wherein the process of forming the gate stack comprises forming a gate dielectric layer on the substrate and a gate electrode on the gate dielectric layer.

7. The method of claim 6, wherein the gate electrode is formed by depositing a conducting material and planarizing the conducting material to the second insulating film.

8. A method of fabricating a transistor on a substrate, comprising:

forming a first insulating film on the substrate;

etching the first insulating film to define therefrom a temporary gate structure and a screen insulating layer adjacent to the temporary gate structure;

forming first and second source/drain regions in the substrate;

forming a second insulating film on the substrate adjacent to the temporary gate structure;

removing the temporary gate structure to define all opening in the screen insulating layer and the second insulating film extending to the substrate; and forming a gate stack in the opening.

9. The method of claim 8, wherein the process of forming first and second source/drain regions comprises implanting impurity ions through the screen insulating layer.

10. The method of claim 8, wherein the process of defining the temporary gate structure comprises applying a mask having a width to a portion of the first insulating film, trimming the width of the mask, and etching unmasked portions of the first insulating film.

11. The method of claim 10, wherein the width of the mask after trimming is less than a maximum resolution of a lithographic patterning system used to initially define the mask.

12. The method of claim 10, wherein the mask comprises resist.

13. The method of claim 8, wherein the process of forming the second insulating film comprises depositing insulating material and planarizing the insulating material to the temporary gate structure.

14. The method of claim 8, wherein the process of forming the gate stack comprises forming a gate dielectric layer on the substrate and a gate electrode on the gate dielectric layer.

15. The method of claim 14, wherein the gate electrode is formed by depositing a conducting material and planarizing the conducting material to the second insulating film.

16. The method of claim 8, comprising forming contacts on the gate stack and the first and second source/drain regions.

17. The method of claim 8, wherein the first and second source/drain regions are formed by implanting impurity ions through the screen insulating layer.

18. A method of fabricating a circuit device on a substrate, comprising:
   forming a first insulating film on the substrate;
   etching the first insulating film to define therefrom a temporary gate structure and a screen insulating layer adjacent to the temporary gate structure;
   performing a first ion implant to define lightly doped drain structures;
   forming a second insulating film on the substrate adjacent to the temporary gate structure;
   performing a second ion implant to define heavier doped regions overlapping the lightly doped drain structures;
   removing the temporary gate structure to define an opening in the screen insulating layer and the second insulating film extending to the substrate; and
   forming a gate stack in the opening.

19. The method of claim 18, wherein the process of defining the temporary gate structure comprises applying a mask to a portion or the first insulating film, trimming the width of the mask, and etching unmasked portions of the first insulating film.

20. The method of claim 19, wherein the width of the mask after trimming is less than a maximum resolution of a lithographic patterning system used to initially define the mask.

21. The method of claim 19, wherein the mask comprises resist.

22. The method of claim 18, wherein the process of forming the second insulating film comprises depositing insulating material and planarizing the insulating material to the temporary gate structure.

23. The method of claim 18, wherein the process of forming the gate stack comprises forming a gate dielectric layer on the substrate and a gate electrode on the gate dielectric layer.

24. The method of claim 23, wherein the gate electrode is formed by depositing a conducting material and planarizing the conducting material to the second insulating film.

25. The method of claim 18, comprising forming contacts on the gate stack and the heavier doped regions.

26. The method of claim 18, wherein the first and second ion implants are performed through the screen insulating layer.

* * * * *

UNITED STATES PATENT AND TRADEMARK OFFICE
CERTIFICATE OF CORRECTION

PATENT NO. : 6,406,950 B1 Page 1 of 1
DATED : June 18, 2002
INVENTOR(S) : Srikanteswara Dakshina-Murthy It is certified that error appears in the above-identified patent and that said Letters Patent is hereby corrected as shown below:

<u>Column 4,</u>
Line 36, delete "or" and substitute -- for -- therefor;
Line 55, delete "nitrite" and substitute -- nitride -- therefor;

<u>Column 5,</u>
Line 19, delete "E" and substitute -- as -- therefor;
Line 39, delete "die" and substitute -- the -- therefor;
Line 62, delete "ate" and substitute -- the -- therefor;

<u>Column 6,</u>
Line 3, delete "plagiarized" and substitute -- planarized -- therefor; and <u>Column 7,</u>
Line 47, delete "arid" and substitute -- and -- therefor.

<u>Column 8,</u>
Line 11, delete "gale" and substitute -- gate -- therefor;
Line 17, delete "gale" and substitute -- gate -- therefor; and
Line 48, delete "all" and substitute -- an -- therefor.

Signed and Sealed this

Nineteenth Day of November, 2002

*Attest:*

*Attesting Officer*

JAMES E. ROGAN
*Director of the United States Patent and Trademark Office*